United States Patent
Lee

(10) Patent No.: US 7,018,927 B2
(45) Date of Patent: Mar. 28, 2006

(54) METHOD FOR FORMING ISOLATION FILM FOR SEMICONDUCTOR DEVICES

(75) Inventor: Joon Hyeon Lee, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 225 days.

(21) Appl. No.: 10/705,010

(22) Filed: Nov. 10, 2003

(65) Prior Publication Data
US 2005/0020075 A1    Jan. 27, 2005

(30) Foreign Application Priority Data
Jul. 23, 2003    (KR) .................. 10-2003-0050620

(51) Int. Cl.
*H01L 21/311*    (2006.01)
(52) U.S. Cl. .................. 438/700; 438/296; 438/424
(58) Field of Classification Search ............ 438/700, 438/702, 704, 706, 719, 723, 725, 745, 753, 438/757, 221, 222, 296, 424, 425
See application file for complete search history.

(56) References Cited

U.S. PATENT DOCUMENTS

| | | | | |
|---|---|---|---|---|
| 5,648,281 A * | 7/1997 | Williams et al. | ............ | 438/358 |
| 5,821,145 A * | 10/1998 | Goo | ............ | 438/294 |
| 6,188,110 B1 * | 2/2001 | Gardner et al. | ............ | 257/368 |
| 6,228,746 B1 * | 5/2001 | Ibok | ............ | 438/425 |
| 6,482,717 B1 * | 11/2002 | Hahn | ............ | 438/429 |
| 2002/0093041 A1 * | 7/2002 | Hong | ............ | 257/301 |

* cited by examiner

*Primary Examiner*—Kin-Chan Chen
(74) *Attorney, Agent, or Firm*—Ladas & Parry LLP

(57) ABSTRACT

An isolation film for semiconductor devices is formed from a pad oxide film and a pad nitride film on a substrate, etching the pad nitride film, the pad oxide film and the substrate to form a trench in an active region of the substrate; forming a sidewall oxide film on the surface of the trench; removing the pad nitride film; forming a linear nitride film on the sidewall oxide film and the pad oxide film; removing a portion of the pad oxide film on the substrate; removing the exposed pad oxide film to expose the field region of the substrate; oxidizing the exposed field region to form an oxide film; removing the sidewall oxide film to expose the active region of the substrate; and forming a silicon epitaxial layer serving as an active layer on the exposed active region of the substrate to the same height as the oxide film.

13 Claims, 8 Drawing Sheets

METHOD FOR FORMING ISOLATION FILM FOR SEMICONDUCTOR DEVICES

BACKGROUND OF THE INVENTION

1. Field of the Invention

The present invention relates to a method for forming an isolation film for semiconductor devices, and more particularly to a method for forming an isolation film for semiconductor devices, which can prevent an active region from being attacked and to make a such a process simple.

2. Description of the Prior Art

With the advancement of semiconductor technologies, the high-speed operation and high-density integration of semiconductor devices is progressing rapidly, and at the same time, requirements for the minuteness of a pattern and the high precision of pattern size are being gradually increased. In addition to a pattern formed in the device region, such requirements are also applied to an isolation region occupying a relatively large area in a semiconductor substrate. This is because the width of an isolation region needs to be reduced so as to increase the width of a device region, according to a tendency where the width of the isolation region is reduced as the integration density of devices becomes higher.

An isolation film providing the isolation between semiconductor devices has been formed by a local oxidation of silicon (LOCOS) process. As well known in the art, however, the isolation film formed by the LOCOS process is disadvantageous in that a "bird's beak" is formed at the edge of the isolation film such that the area of the isolation film is increased, causing leakage current.

Thus, in a substitute for the method for forming the isolation film using the LOCOS process, there was proposed a method wherein an isolation film having reduced width and excellent isolation characteristics is formed using a shallow trench isolation (STI) process. Currently, in most of semiconductor devices, the isolation films are formed using the STI process.

Hereinafter, a method for forming an isolation film using the STI process will be described with reference to FIGS. 1A to 1E.

As shown in FIG. 1A, a pad oxide film 2 and a pad nitride film 3 are successively formed on a silicon substrate 1 having an active region and a field region. Then, a portion of the pad nitride film 3 and a portion of the pad oxide film 2 are successively etched to expose a portion of the substrate corresponding to the field region. Then, using the remaining portion of the pad nitride film 3 as an etch barrier, a portion of the substrate exposed through the etched portion of the pad nitride film 3 is etched to form a trench 4.

As shown in FIG. 1B, a buried oxide film 5, such as a high-density plasma (HDP) oxide film, is then deposited on the entire upper surface of the substrate 1 such that the trench 4 is completely filled with the buried oxide film 5.

As shown in FIG. 1C, a photoresist pattern 7 is then formed in such a manner as to cover a portion of the HDP oxide film filled in the trench.

As shown in FIG. 1D, a portion of the HDP oxide film on the active region, which was not covered with the photoresist pattern, is then etched. After removing the photoresist pattern, the HDP oxide film 5 is subjected to chemical mechanical polishing (CMP) such that the pad nitride film 3 is exposed.

As shown in FIG. 1E, the pad nitride film 3 used as the etch barrier in the trench etching is then removed. In this way, a trench type isolation film 5a is formed.

However, the prior method for forming the isolation film using the STI process has the following problems.

As shown in FIG. 1B, a portion of the HDP oxide film deposited on the field region is thicker than a portion of the HDP oxide film deposited on the active region. Thus, if CMP is conducted in this state, dishing can occur on the surface of the HDP oxide film filled in the trench so that the reliability of the isolation film cannot be ensured.

Thus, as shown in FIG. 1C, after depositing the HDP oxide film, the photoresist pattern is formed on the field region in such a manner as to cover the deposited HDP oxide film, and then, the exposed portion of the HDP oxide film on the active region is etched. In this case, however, plasma ions are concentrated on the edge A of a portion of the HDP oxide film to be etched, so that this edge is etched rapidly to cause a micro-trench.

Thus, as shown in FIG. 1D, the edge B of the pad nitride film is attacked due to the influence of the micro-trench when subjecting the HDP oxide film to CMP. Accordingly, as shown in FIG. 1E, the edge C of the active region adjacent to the trench is attacked upon removal of the pad nitride film.

As a result, a hump on the current-voltage curve and an inverse narrow width effect (INWE) caused by the reduction of threshold voltage according to the reduction of transistor width, etc, are caused, so that semiconductor devices operate abnormally and thus the reliability of the devices are not ensured.

In addition, in the prior method for forming the isolation film using the STI process, the steps of forming and removing the HDP oxide film are required for polarizing the HDP oxide film, thereby increasing the number of process steps.

SUMMARY OF THE INVENTION

Accordingly, the present invention has been made to solve the above-mentioned problems occurring in the prior art, and an object of the present invention is to provide a method for forming an isolation film for semiconductor devices, which can prevent an active region from being attacked and to make such a process simple.

To achieve the above objects, the present invention provides a method for forming an isolation film for semiconductor devices, the method comprising the steps of: successively forming a pad oxide film and a pad nitride film on a silicon substrate having an active region and a field region; etching the pad nitride film, the pad oxide film and the silicon substrate to form a trench in the active region of the substrate; forming a sidewall oxide film on the surface of the trench; removing the pad nitride film; forming a linear nitride film on the sidewall oxide film and the pad oxide film; subjecting the linear nitride film to chemical mechanical polishing (CMP) such that a portion of the pad oxide film on the field region of the substrate is exposed; removing the exposed pad oxide film to expose the field region of the substrate; oxidizing the exposed field region of the substrate to form an oxide film to the same depth as the bottom of the trench; removing the linear nitride film; removing the sidewall oxide film to expose the active region of the substrate; and forming a silicon epitaxial layer serving as an active layer on the exposed active region of the substrate to the same height as the oxide film.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

FIGS. 2A to 2J are cross-sectional views for describing a method for forming an isolation film for semiconductor devices according to a preferred embodiment of the present invention.

Figure 1A:
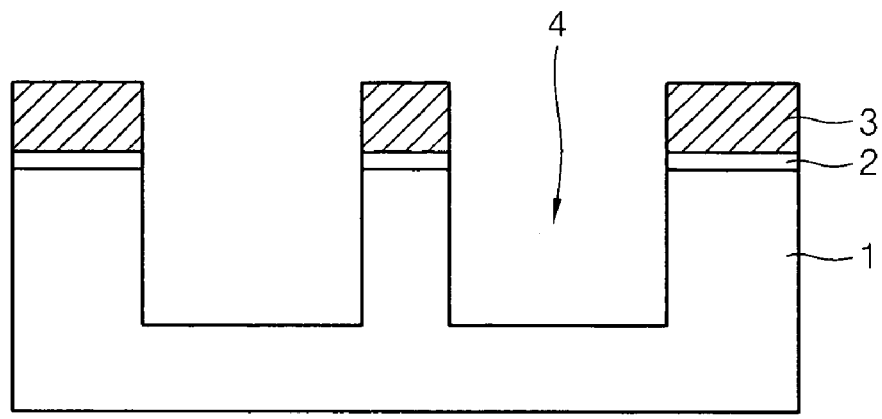
FIGS. 1A to 1E are cross-sectional views for describing a method for forming an isolation film for semiconductor device's according to the prior art.
Figure 1B:
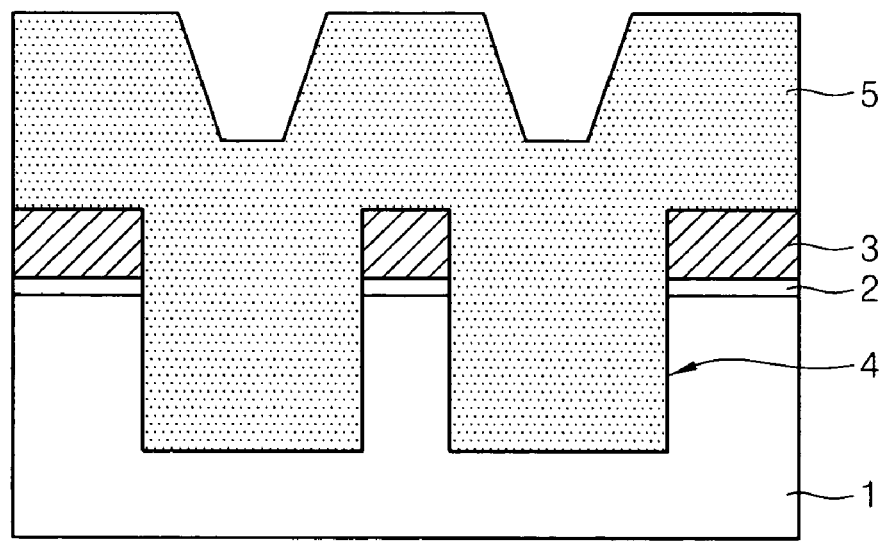
Figure 1C:
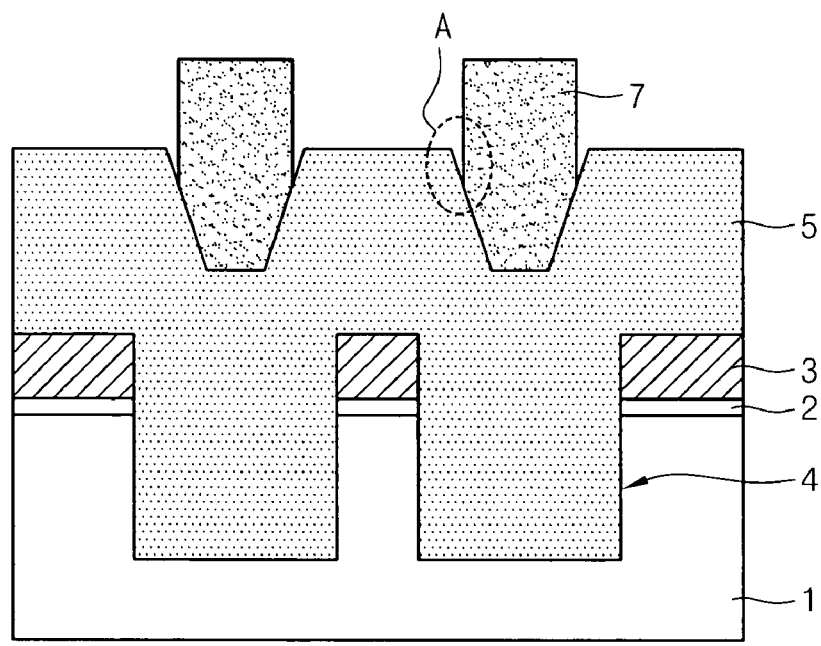
Figure 1D:
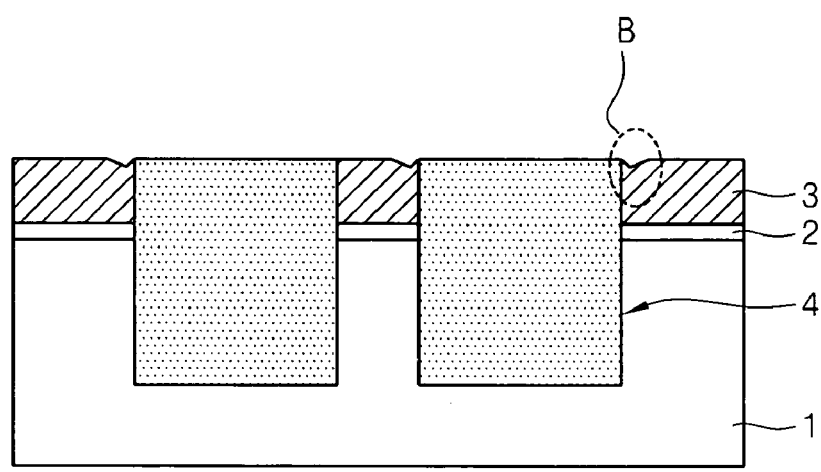
Figure 1E:
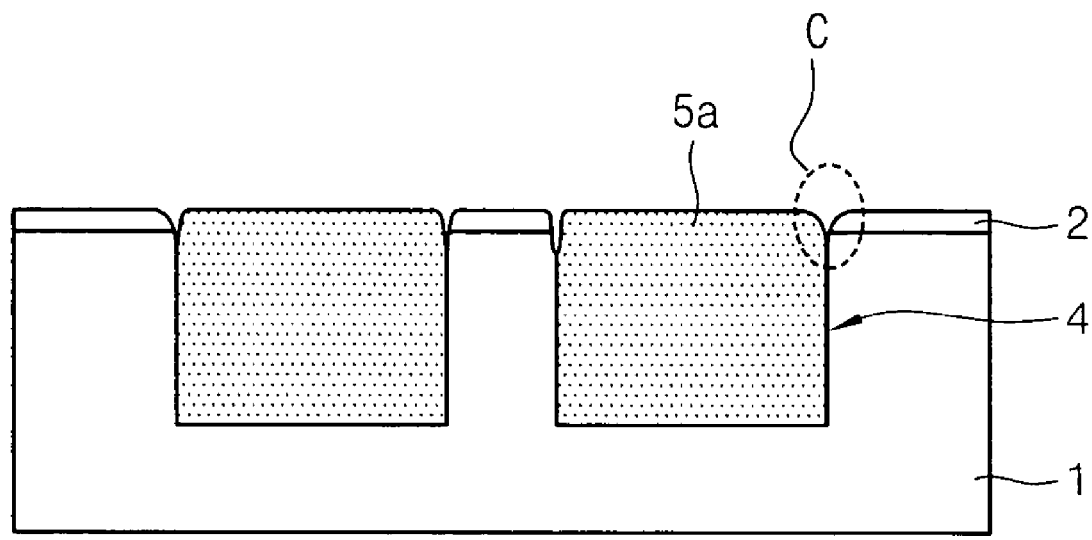
Figure 2A:
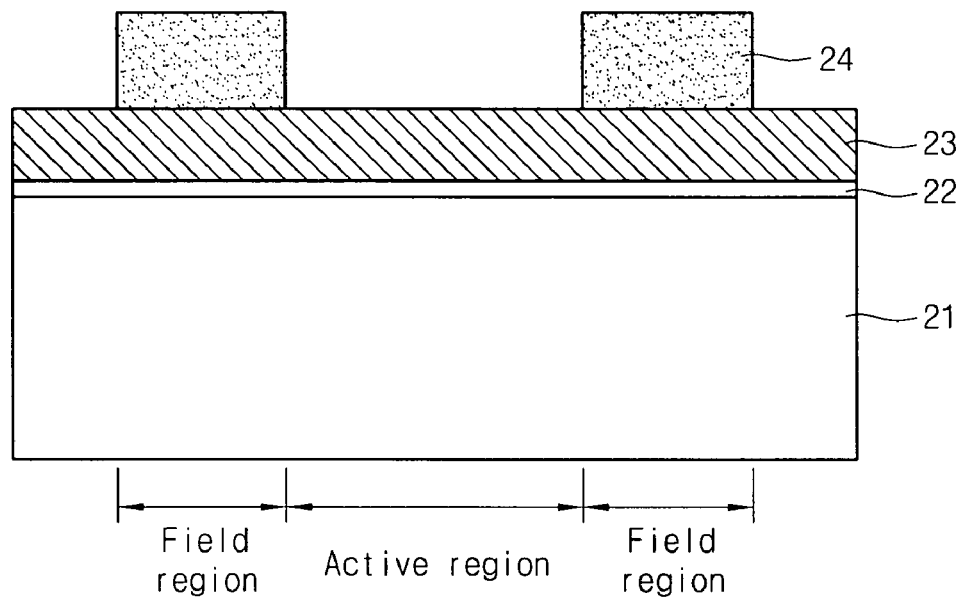
FIGS. 2A to 2J are cross-sectional views for describing a method for forming an isolation film for semiconductor devices according to a preferred embodiment of the present invention.

As shown in FIG. 2A, a pad oxide film 22, a pad nitride film 23 and a photoresist pattern 24 are formed on a substrate 21 having an active region and a field region. The photoresist pattern 24 is formed in such a manner to close the field region while opening the active region in the reverse manner to that of the prior art where the field region is opened.

Figure 2B:
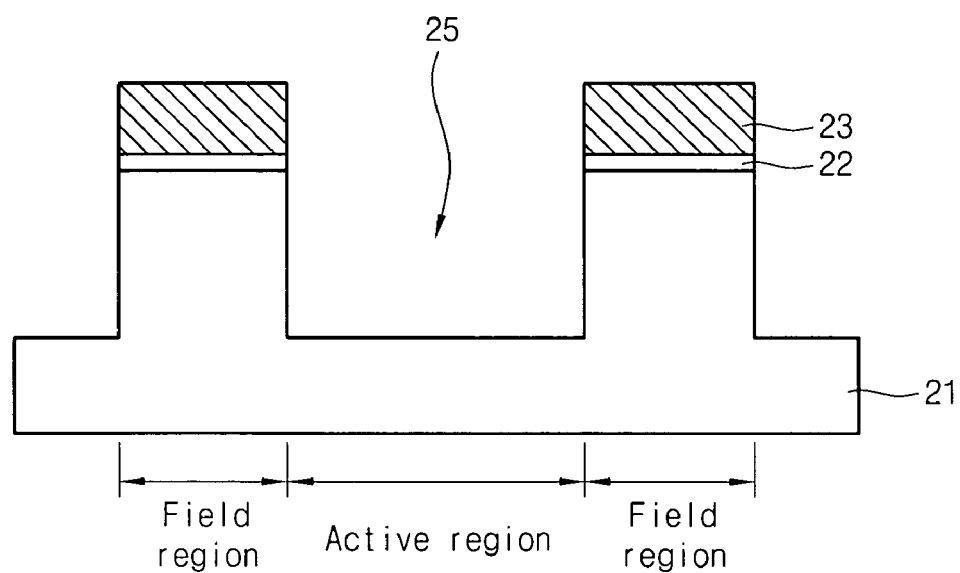

Then, as shown in FIG. 2B, the exposed portion of the pad nitride film 23 and a portion of the pad oxide film 22 beneath the pad nitride film 23 are successively etched using the photoresist pattern 24 as an etch barrier. Subsequently, the exposed portion of the substrate 21 is etched to form a trench 25 in the active region of the substrate 21. The pad nitride film 23 can be dry-etched with a $CHF_3/CF_4/O_2/Ar$ mixture plasma. $C_xF_y$ (x and y=natural numbers) may also be used in a substitute for $CHF_3$ and $CF_4$ of the mixture plasma. Alternatively, this etching may be conducted by dry etching using a $Cl_2/HBr/He—O_2/Ar$ mixture plasma, in this case, the mixture plasma may additionally contain $N_2$ plasma, and $O_2$ may be used in a substitute for $He—O_2$. Also, a $C_2/O_2/Ar$ mixture plasma may be used in a substitute for the $Cl_2/HBr/He—O_2/Ar$ mixture plasma.

Figure 2C:
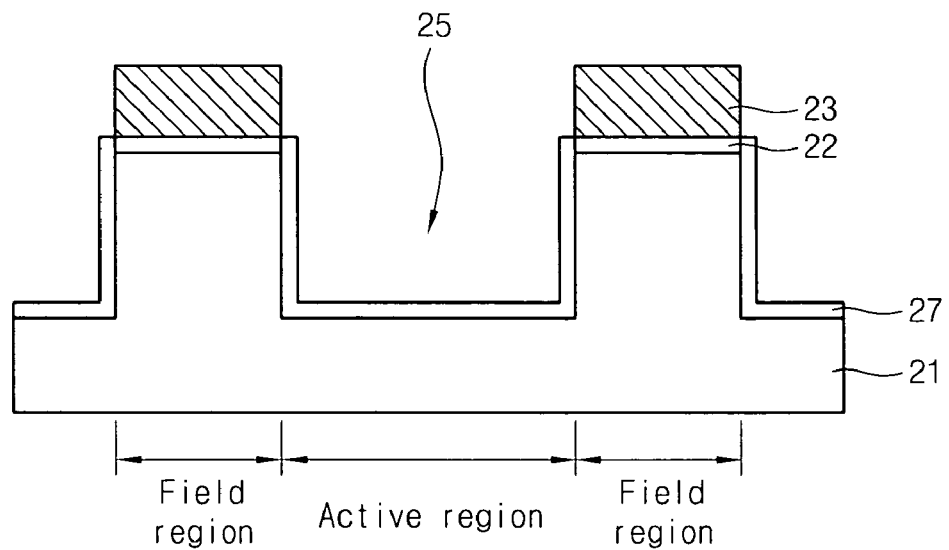

As shown in FIG. 2C, the resulting substrate 21 is then oxidized to form a sidewall oxide film 27 on the surface of the trench 25. This sidewall oxide film 27 is formed only on the surface of the trench 25, but not on the pad nitride film 23. The sidewall oxide film 27 serves to prevent application of stress to the substrate 21 during a subsequent step of depositing a linear nitride film.

Figure 2D:
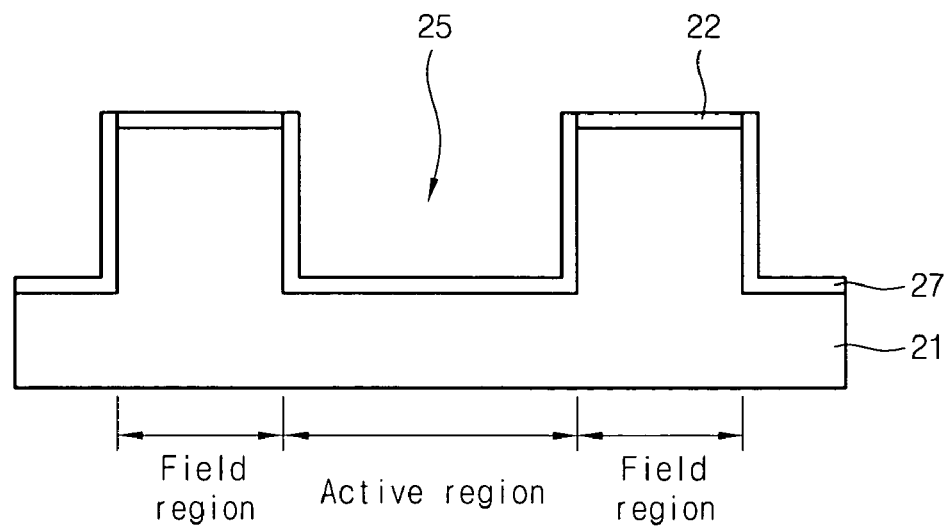

As shown in FIG. 2D, the pad nitride film 23 is then etched by a down flow method using $CF_4$ and $O_2$ gases. In etching the pad nitride film 23 by the down flow method, the etching selectivity of the pad nitride film 23 to the pad oxide film 22 is more than 12:1. Thus, the pad nitride film 23 is etched rapidly while the sidewall oxide film 27 remains unetched. Etching of the pad nitride film 23 can be conducted by wet etching using a $H_3PO_4$ solution.

Figure 2E:
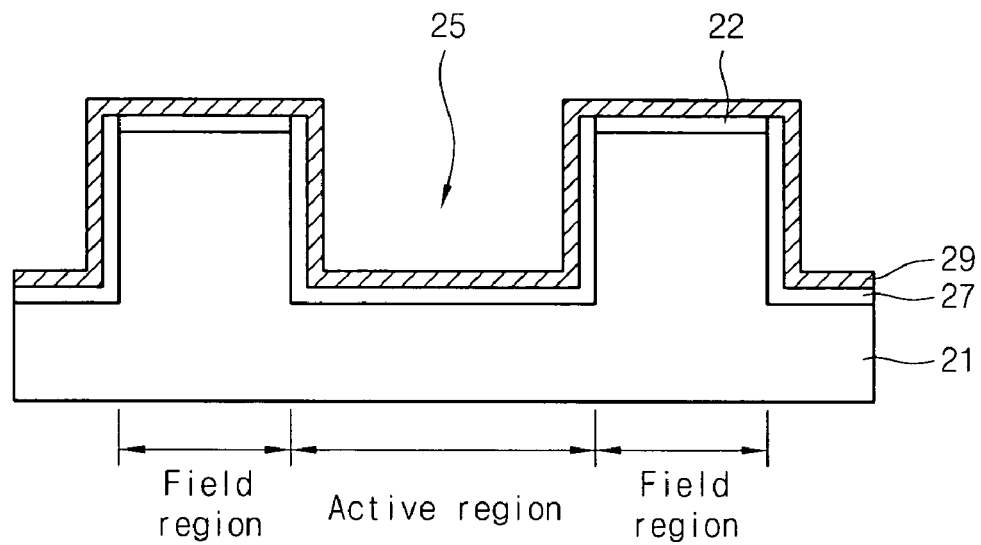

As shown in FIG. 2E, a linear nitride film 29 is then deposited on the pad oxide film 22 and the sidewall oxide film 27.

Figure 2F:
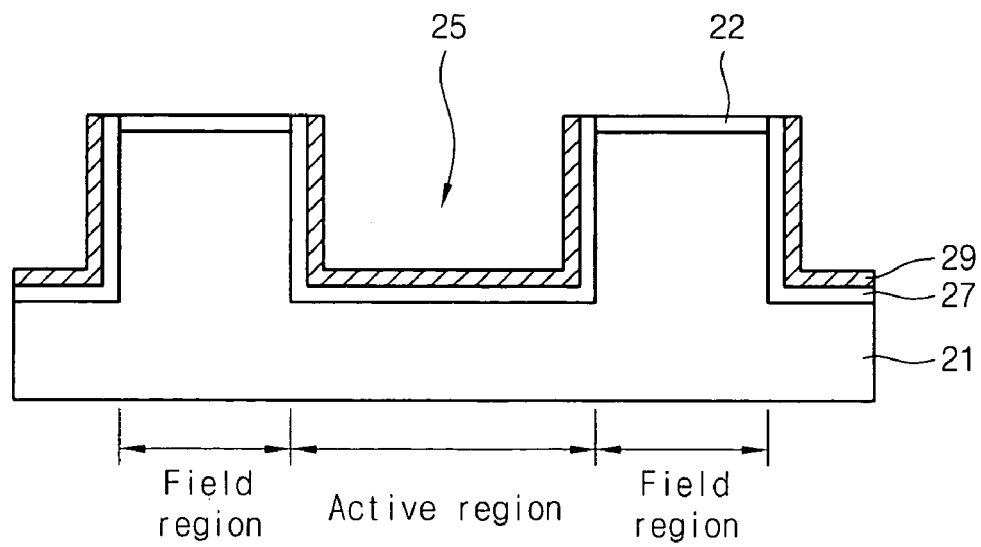

As shown in FIG. 2F, the linear nitride film 29 is then subjected to chemical mechanical polishing (CMP) such that a portion of the pad oxide film 22 remains on the field region of the substrate 21. In this case, the CMP is conducted using the pad oxide film 22 as a polishing stopper layer, or conducted by over-polishing such that some thickness of the pad oxide film 22 is removed together.

Figure 2G:
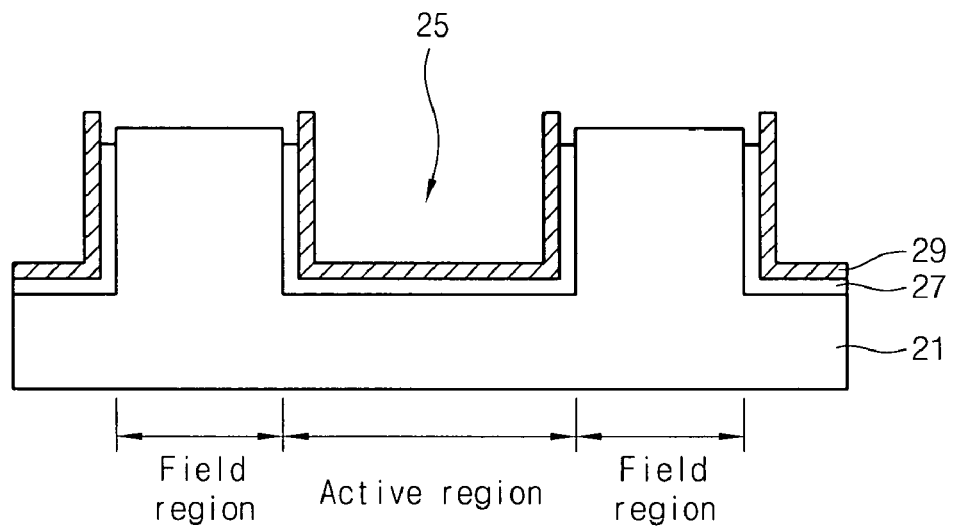

As shown in FIG. 2G, the exposed portion of the pad oxide film 22 on the field region of the substrate 21 is then removed by slight etching to expose the field region of the substrate 21. In this case, slight etching of the pad oxide film 22 is conducted by a wet etching manner using a BOE- or HF-based solution. Moreover, this slight etching may also be conducted by a dry etching method using an activated plasma of $C_xF_y$-based gas. If the dry etching using the activated plasma is conducted, etching of the linear nitride film 29 will not occur during etching of the pad oxide film since the etch selectivity of the oxide film to the nitride film is high. If the wet etching using the HF-based solution is conducted, native oxide films or contaminants present on the silicon substrate 21 can be completely removed.

Figure 2H:
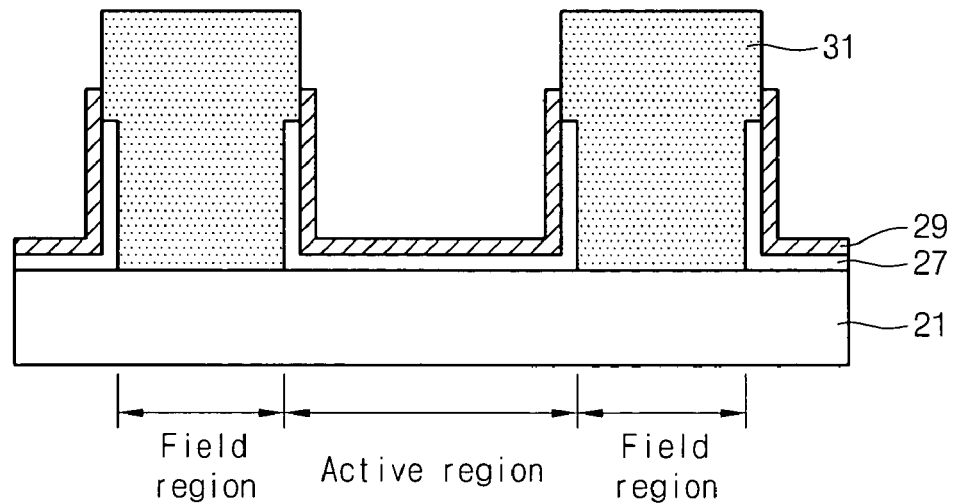

As shown in FIG. 2H, the resulting substrate is then subjected to an oxidation process to form an oxide film 31 on the exposed field region of the substrate 21. In this case, the oxide film 31 is formed according to a principle where it grows at the ratio of 60% in the upper direction of the silicon substrate surface to 40% in the lower direction direction with respect to the surface of the silicon substrate. The oxide film 31 is formed to the desired depth since it acts as an isolation film. Preferably, the oxide film 31 is formed in such a manner that its upper end is higher than the upper end of the trench 25 and its lower end has the same depth as the bottom of the trench 25. During the oxidation process, an oxide film is not formed within the trench 25 since the trench surface has the linear nitride film 29 formed thereon.

Figure 2I:
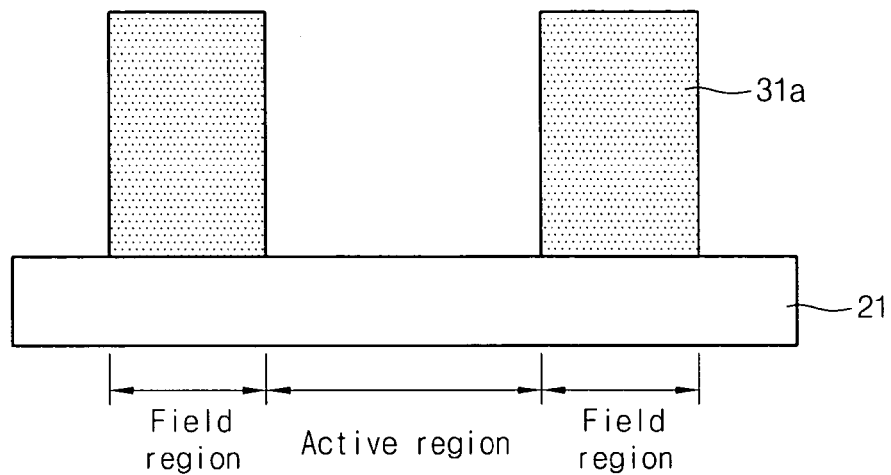

As shown in FIG. 2I, the remaining linear nitride film 29 is then removed by a down flow method using $CF_4$ and $O_2$ gases. Removal of the linear nitride film 29 may also be conducted by wet etching using an $H_3PO_4$-based solution. Then, the remaining sidewall oxide film is removed by wet etching using a HF-based solution. As a result, the active region of the substrate 21 is exposed while an isolation film 31a remains on the field region of the substrate.

Figure 2J:
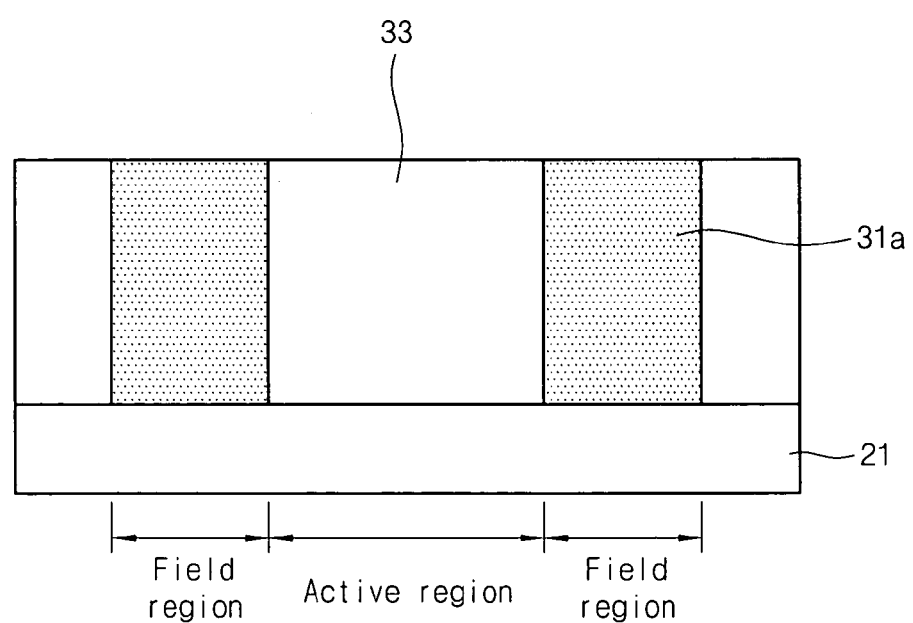

As shown in FIG. 2J, a silicon epitaxial layer 33 is then grown on the exposed active region of the substrate 21 to the same height as the isolation film 31a according to a selective epitaxial growth (SEG) process, thereby forming an active layer.

As described above, in the forming method of the isolation film according to the present invention, the isolation film is formed by selective oxidation of the field region of the substrate, but not by formation of a trench, deposition of a buried oxide film into the trench and CMP of the buried oxide film. Thus, the isolation film is free from the occurrence of dishing caused by the non-uniform thickness of the buried oxide film.

Moreover, in the method of the present invention, a photoresist pattern for the pre-polarization of the buried oxide film does not need to be formed so that the problem of the increase of process steps is solved. In addition, since the method of the present invention is free from a microtrench occurring upon pre-polarization of the buried oxide film, the edge of the pad nitride film is prevented from being attacked and thus the edge of the active region of the substrate is prevented from being attacked. Therefore, the method of the present invention can fundamentally prevent the abnormal operation of semiconductor devices, such as Hump and INWE phenomena, from being caused.

As described above, in the method of the present invention, since the buried oxide film for filling the trench does not need to be deposited, the problem of void formation in the trench is fundamentally solved. Furthermore, since the buried oxide film does not need to be deposited, a process of forming a difference in step height between the active region and the field region and a process of removing the step height difference using the same are not required. Thus, the present invention can make a process simple. Moreover, in the method of the present invention, limitations on an etching process can be overcame, since a relatively wide active region is etched according to a tendency where the width of the field region becomes smaller due to the high-density integration of semiconductor devices. In addition, since the active layer consisting of the silicon epitaxial layer is formed on the active region of the substrate after forming the isolation film, an edge moat on the active layer can be prevented from occurring. Thus, the abnormal operation of devices caused by Hump and INWE phenomena can be prevented to ensure the reliability of the devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming an isolation film for semiconductor devices, the method comprising the steps of:
   successively forming a pad oxide film and a pad nitride film on a silicon substrate having an active region and a field region;
   etching the pad nitride film, the pad oxide film and the silicon substrate to form a trench in the active region of the substrate;
   forming a sidewall oxide film on the surface of the trench;
   removing the pad nitride film;
   forming a linear nitride film on the sidewall oxide film and the pad oxide film;
   subjecting the linear nitride film to CMP such that a portion of the pad oxide film on the field region of the substrate is exposed;
   removing the exposed pad oxide film to expose the field region of the substrate;
   oxidizing the exposed field region of the substrate to form an oxide film to the same depth as the bottom of the trench;
   removing the linear nitride film;
   removing the sidewall oxide film to expose the active region of the substrate; and
   forming a silicon epitaxial layer serving as an active layer on the exposed active region of the substrate to the same height as the oxide film.

2. The method of claim 1, wherein the step of etching the pad nitride film is conducted using a $CHF_3/CF_4/O_2/Ar$ mixture plasma.

3. The method of claim 1, wherein the step of forming the trench is conducted using a $Cl_2/HBr/He\text{---}O_2/Ar$ mixture plasma.

4. The method of claim 3, wherein the mixture plasma contains $O_2$ in a substitute for $He\text{---}O_2$.

5. The method of claim 3, wherein the step of forming the trench is conducted using a $Cl_2/O_2/Ar$ mixture plasma.

6. The method of claim 3, wherein the mixture plasma additionally contains $N_2$.

7. The method of claim 1, wherein the forming of removing the pad nitride film is conducted by a down flow method using $CF_4$ and $O_2$ gases.

8. The method of claim 7, wherein the down flow method is conducted at the etching selectivity of the pad nitride film to the pad oxide film of more than 12:1.

9. The method of claim 1, wherein the step of removing the pad nitride film is conducted by a wet etching method using a $H_3PO_4$ solution.

10. The method of claim 1, wherein the step of removing the sidewall oxide film is conducted by a wet etching manner a BOE- or HF-based solution.

11. The method of claim 1, wherein the steps of removing the pad oxide film and the sidewall oxide film are conducted by activated plasma.

12. The method of claim 1, wherein the step of forming the oxide film is conducted in such a manner that the oxide film is formed at a ratio of 60% in the upper direction of the silicon substrate surface to 40% in the lower direction of the silicon substrate surface.

13. The method of claim 1, wherein the step of removing the linear nitride film is conducted by a down flow method using $CF_4$ and $O_2$ gases, or a wet etching method using a $H_3PO_4$ solution.

* * * * *